United States Patent

Schafer

[15] 3,673,468

[45] June 27, 1972

[54] SEMICONDUCTOR RECTIFYING ARRANGEMENT

[72] Inventor: Horst Schafer, Wendelstein, Germany

[73] Assignee: Semikron Gesellschaft fur Gleichrichterbau und Elektronik m.b.H., Nurnberg, Germany

[22] Filed: March 30, 1970

[21] Appl. No.: 23,690

[30] Foreign Application Priority Data

April 1, 1969 Germany ....................... P 19 16 555.0

[52] U.S. Cl. .............................................. 317/234, 317/235

[51] Int. Cl. ........................................................ H01l 5/00

[58] Field of Search .......................................... 317/234, 235

[56] References Cited

UNITED STATES PATENTS

| | | | |
|---|---|---|---|
| 2,667,607 | 1/1954 | Robinson | 317/234 |
| 2,969,497 | 1/1961 | Kiyasu | 317/234 |
| 2,994,121 | 8/1961 | Shockley | 317/234 |
| 3,159,780 | 12/1964 | Parks | 321/46 |
| 3,235,779 | 2/1966 | Zacharellis | 317/234 |
| 3,005,937 | 10/1961 | Wallmark | 317/235 |
| 2,655,625 | 10/1953 | Burton | 317/235 |

*Primary Examiner*—James D. Kallam
*Attorney*—Spencer & Kaye

[57] ABSTRACT

A single plate of semiconducting material is provided with n-conducting and p-conducting zones at predetermined locations. The grooves are placed in the plate as a function of the location of the n- and p-conducting zones. Metal conductive paths are then placed on the semiconducting plate as a function of the location of the n- and p-conducting zones and the grooves. There results, for example, a rectifying bridge circuit formed in a single piece of semiconducting material.

9 Claims, 6 Drawing Figures

INVENTOR
Horst Schäfer

BY Spencer & Kaye

ATTORNEYS.

INVENTOR
Horst Schäfer

BY Spencer & Kaye

ATTORNEYS.

SEMICONDUCTOR RECTIFYING ARRANGEMENT

BACKGROUND OF THE INVENTION

The present invention relates to a semiconductor rectifying arrangement having at least two unsymetrically conducting systems. The arrangement is formed in a single body of semiconducting material. Each system exhibits a pn-junction. Metallic conductive paths on the surfaces of the semiconducting body connect the systems into a rectifying circuit.

The continually increasing requirements on semiconducting components for simplification and automation of installations, devices, and processes, means ever increasing demands for more advantageous designs of semiconductor rectifying arrangements, both for power electronics and for miniature switching circuits.

In semiconductor rectifying arrangements of known types, at least one semiconductor tablet is arranged in an appropriate housing with electrically and mechanically appropriate metallic components whose form of construction, manufacture, and working is usually very expensive. Such arrangements must frequently be assembled in special manner and inconveniently connected, in order to produce rectifying circuits.

Known semiconductor rectifying arrangements in plastic housings, whose design enables the mass production of rectifying units, do not always meet special requirements as to size and/or economy.

Furthermore, it is known to make semiconductor components using the so-called planar technology. These do have advantages of size, but exhibit certain limitations relative to electrical design parameters.

SUMMARY OF THE INVENTION

An object of the present invention, therefore, is to provide a semiconductor rectifying arrangement comprising two or more semiconductor rectifying elements, wherein the separate elements are mated together spatially and in regard to ease of interconnection and are electrically connected in simple and economical manner.

This as well as other objects which will become apparent in the discussion that follows are achieved, according to the present invention, by a semiconductor body having a pn-junction. This body is divided into at least two systems by at least one groove which extends into the semiconductor body from a predetermined contact surface perpendicularly through the pn-junction. One continuous metallic contact is provided on the side of the semiconductor body opposite to the side containing the groove.

The invention is furthermore concerned with a method for making such semiconductor arrangements. In the method of the present invention, a semiconductor body is provided with conductivity zones on two mutually opposing sides. These zones form at least one pn-junction. The semiconductor body is furthermore provided with a metallic coating for contact purposes.

The method of the present invention is characterized in that zones of alternatingly opposite conductivity type are provided by known diffusion and masking techniques on the opposing sides of the body. These zones have the same dimensions and form pn-junctions with their neighbors. The zones on both sides are provided with contact coatings. Then, using known photo-etching techniques, slit-shaped grooves are formed extending from one of the sides into the zone of the other side.

DESCRIPTION OF THE PREFERRED EMBODIMENTS

Figure 1A:
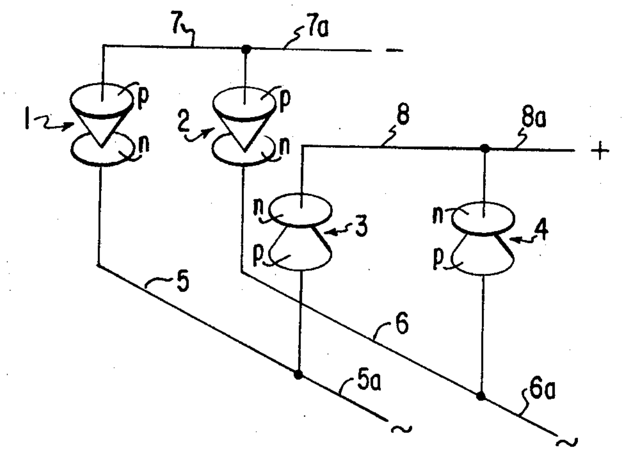
FIG. 1*a* is a schematic diagram for a semiconductor rectifying arrangement known as a single-phase bridge circuit.

The schematically illustrated circuit in FIG. 1*a* includes two parallel branches each having two series-connected rectifying elements showing a p-n semiconductor region sequence. In accordance with convention, the conical portions of the rectifying symbol represent p-type semiconductor regions while the plate portions of the symbols represent n-type semiconductor regions. The two rectifying elements 1 and 2, which are so spatially arranged that the conical points of their symbols point in the same direction, are connected to the common p-connection 7 thence to lead 7*a*. The two other rectifying elements 3 and 4, which both point in the same direction and which point oppositely to elements 1 and 2, are connected to the common n-connection 8, thence to lead 8a. The pairs of oppositely pointing elements, 1 and 3 and 2 and 4, have their remaining electrodes, at regions of opposite conductivity type, connected to the common alternating current connections 5 and 6, respectively, thence to leads 5*a* and 6*a*. The arrangement of rectifying elements in FIG. 1*a* exhibits, on the one hand, two planes each of which is determined by the line of a direct current connection and two rectifying elements pointing in the same direction and, on the other hand, at right angles to the first two planes, two more planes each of which is determined by two oppositely pointing rectifying elements and the line of an alternating current connection.

Figure 1B:
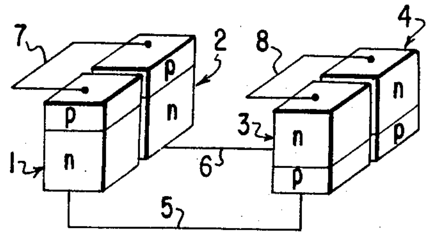
FIG. 1*b* is a more concrete representation of the schematic diagram of FIG. 1*a*.

FIG. 1*b* shows four semiconductor bodies containing pn-junctions and arranged in the manner schematically illustrated in FIG. 1*a*. The connections 5 and 6, and 7 and 8, are to be provided in the form of strip-shaped metallic conductors.

FIG. 1b suggest that the p-conductive regions of elements 1 and 2 which are connected by conductor 7, could be merged into a single p-conductive region and the resulting common surface could be provided with a metallic coating to form connection 7. Similar consideration holds for the n-conductive regions of elements 3 and 4 and their common connection 8.

Figure 2:
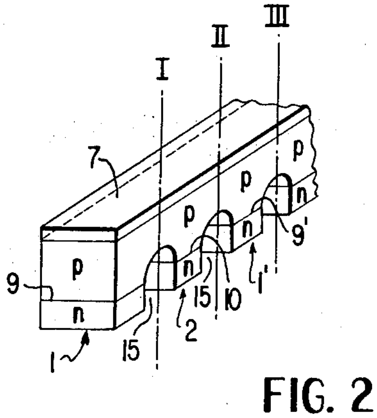
FIG. 2 is a perspective view of one basic semiconductor building block of the present invention.

An embodiment of this suggestion is illustrated in FIG. 2. There a single semiconductor body contains two oppositely conductive zones, one arranged above the other. Slit-shaped grooves 15 are arranged about the three dot-dashed lines I, II, and III. These grooves extend from the lower surface of the n-conductive zone, perpendicularly to the longitudinal axis of the semiconductor body, past the pn-junction and separate the semiconductor body into the single rectifying elements 1, 2, and 1' having respectively the separated pn-junctions 9, 10, and 9'. The pn-junctions are connected mechanically and electrically to one another on the side of the p zone. The common upper surface is available for the purpose of contacting with a continuous, metallic, conductive path 7. This conductive path forms the p-connection.

The number of grooves determines the number of the separate pn-junctions. The grooves can, if required, run parallel to one another.

It will be evident to one skilled in the art that elements 1 and 2 of FIG. 1*b* can be provided from the semiconductor body of FIG. 2 by physically splitting the body between the pn-junction 10 and the pn-junction 9'. Pn-junction 9 would then form the pn-junction of element 1 in FIG. 1*b* while pn-junction 10 would form the pn-junction of element 2 in FIG. 1*b*. Similarily, it is possible to provide elements 3 and 4 of FIG. 1*b* by running grooves downwards in FIG. 2 rather than upwards, by placing a conductive path 8 on the bottom of the semiconductor body, and by physically separating the semiconductor body after the second pn-junction.

Carrying the conceptual development of the present invention still further, the rectifying elements 3 and 4 are moved leftwards in FIG. 1*b* until they abut against elements 1 and 2. Then elements 3 and 4 are moved upwards until their horizontally lying pn-junctions lie in the plane of the pn-junctions of elements 1 and 2. One will observe that there is formed a single semiconductor body having a horizontally lying plane across which are arranged, in mutually facing relationship, p-conductive zones and n-conductive zones. Furthermore, the single semiconductor body contains a vertical plane also across which are arranged in mutually facing relationship p-conductive zones and n-conductive zones.

Figure 3:
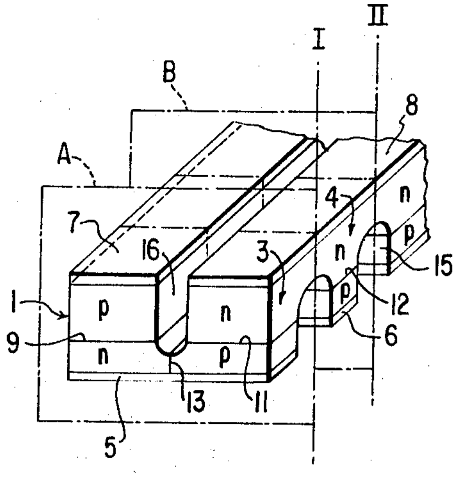
FIG. 3 is a perspective view of a second semiconductor building block of the present invention.

A single semiconductor body of the type conceptually constructed with FIG. 1*b* is shown in FIG. 3. The body has been given an arbitrarily large dimension in the direction perpendicular to planes A and B, as was similarily done for the semiconductor body of FIG. 2. The body of FIG. 3 is shown broken off for the purpose of ease of illustration. Grooves 15 arranged about the dot-dashed lines I and II in planes A and B extend upwardly from the lower surface of the semiconductor body as in FIG. 2. These grooves 15 extend completely from the right face of the semiconductor body to the hidden left face in FIG. 3. Groove 16 has removed the upper portion of the vertical pn-junctions. It extends downwards in FIG. 3 from the top of the semiconductor body, passes through the horizontal plane of p-n junctions and cuts into the groove 15 perpendicularly. By extending the groove 15 on plane B upwards completely through the semiconductor body, one achieves an arrangement of rectifying elements completely analogous to the arrangement shown in FIG. 1*b*. Thus, as shown in the FIG. 3, element 1 contains pn-junction 9, element 3 contains pn-junction 11, and element 4 contains pn-junction 12. Pn-junction 10 of element 2 is hidden in FIG. 3 but appears in FIG. 4 which is described below. The element systems formed by elements 1 and 2 as one system and elements 3 and 4 as a second system are provided on their upper contact surfaces arranged parallely about groove 16 with metallic, conductive paths 7 and 8. These paths and the upper contact surfaces are arranged in parallel to groove 16. The lower contact surfaces separated by groove 15 run at right angles to the contact surfaces carrying conductive paths 7 and 8. These lower, strip-shaped surfaces are provided with metallic, conductive paths 5 and 6 to form the alternating current connections. It is to be noted that the conductive path 5 short-circuits a remaining vertical pn-junction 13 lying in the tie at the tip of groove 16 on the bottom side of the semiconductor body, while conductive path 6 similarly short-circuits a remaining vertical pn-junction 14 lying in a tie hidden in FIG. 3 but shown in FIG. 4 described below.

Figure 4:
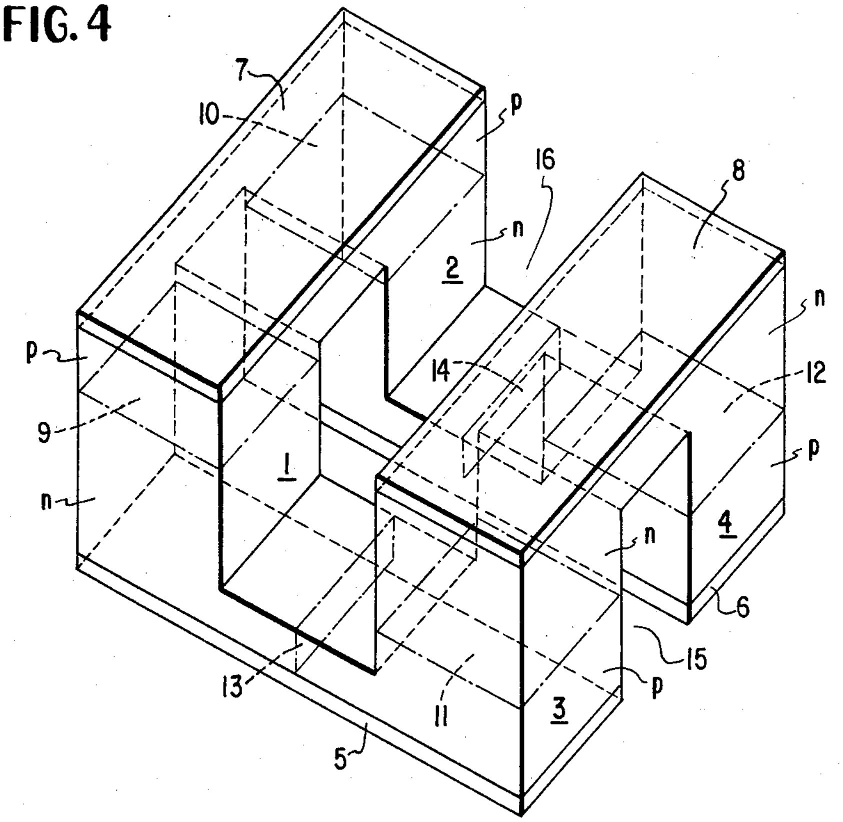
FIG. 4, which is likewise perspective, shows one embodiment of an arrangement according to the invention.

FIG. 4 is an enlarged perspective illustration of an especially advantageous embodiment of the arrangement of the invention. The arrangement of FIG. 4 results from FIG. 3 upon separation on plane B. The shaded surfaces show the active pn-junctions 9 to 12 of the separate elements and the two short-circuited pn-junctions 13 and 14. The grooves 15 and 16, which lie in two mutually intersecting planes, separate the semiconductor body into four separate elements 1 to 4 of predetermined electrical functions while the remaining interconnecting semiconductor material and the metallic conducting paths provide the arrangement with mechanical stability. The dimensions of the separate elements, of the conductive paths, and of the grooves are matched to the electrical power which the arrangement must withstand under its design conditions.

Figure 5:
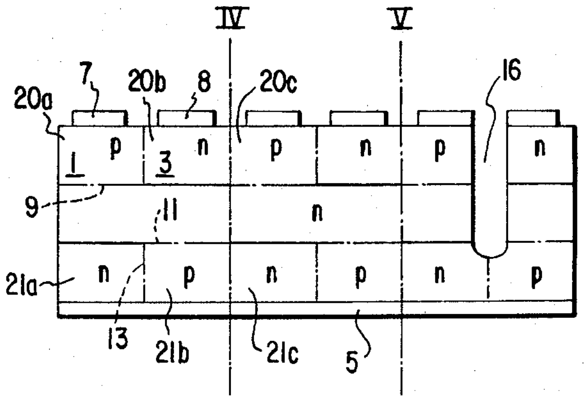
FIG. 5, is an elevational view of a semiconductor plate used in a method according to the present invention.

To make the semiconductor arrangement of the present invention, a plate 19 (FIG. 5) of semiconductor material, for example of slightly n-conducting silicon, is provided by means of conventional oxidation, photoresist, and diffusion processes on both the top and bottom surfaces with strip-shaped and mutually parallel zones 20*a*, 20*b*, 20*c*, etc., and 21*a* 21*b*, 21*c*, etc. of alternatingly opposite conductivity type extending perpendicularly from the plane of FIG. 5 away from the viewer. The zones of both surfaces have the same dimensions and the zones on the top surface are aligned opposite the zones on the bottom surface. Thus, for example, there is coincidence of the orthogonal projections of zones 20*a* and 21*a* onto a plane perpendicular to the plane of FIG. 5 and intersecting the plane of FIG. 5 on a line horizontal in FIG. 5. Furthermore, each zone forms pn-junctions both with the neighboring zones on the same surface and with the neighboring zone on the opposing surface. Finally, both doped surfaces are completely covered with a suitable metallic coating, for example with one or more nickel layers. Then, an appropriate etching mask is put in place for making the slit-shaped grooves 15 and 16. As illustrated in FIG. 5, the etching process cuts away the vertical pn-junction of the upper zones in the forming of groove 16. At the same time, the two separate conductive paths 7 and 8 are formed. For purposes of illustration, only the right-hand third of FIG. 5 is shown with a groove 16, while all the paths 7 and 8 have already been formed. Etching of groove 16 down into the lower series of zones produces strip-shaped semiconductor bodies extending perpendicularly to the plane of FIG. 5. These strip-shaped semiconductor bodies are of the same conductivity type into and out of the plane of the FIG. 5, while there is an alternation left and right in FIG. 5 between n- and p- conductivity type zones. At right angles to groove 16, grooves 15 (FIG. 4) are formed, running from the lower surface of the semiconductor plate 19. The grooves 15 run parallel to one another and extend into the upper series of zones. The grooves 15 divide the strip-shaped semiconductor bodies into operable separate rectifying elements. Since the upper and lower zones are not effectively diffused to the middle elevation in the plate 19 and since the plate was for example slightly n-conductive to begin with, the active pn-junctions occur alternately at the upper (9) and lower (11) effective interfaces. Between the grooves 15 and between the grooves 16, the semiconductor body is etched completely through to divide the starting plate 19 up into separate units. The etching masks can be formed in such a manner that the semiconductor body is etched completely through after every second element, for example at the dot-dashed lines IV and V, thereby forming semiconductor arrangements according to FIG. 4.

The desired current carrying ability of the final semiconductor arrangement determines the number of rectifying arrangements which can be produced from a single starting plate of given size. For example, if the design power is large, it may prove desirable to make only one arrangement of FIG. 4 from a given plate. Usual considerations regarding making the conductive paths hold for determining the size of the semiconductor starting plate. The making of the conductive paths can be according to conventional processes. Further working of the arrangement of the present invention into an electrical component ready for connection into a circuit, if required, in encapsulated form, can be performed in various conventional processes.

The present invention is not limited to the particular examples given. From FIGS. 2, 3, and 5, one skilled in the art will perceive that it is possible by suitable forming an arranging of etching masks to equally advantageously produce semiconductor rectifying arrangements in all currently used interconnections of separate rectifying elements. The separation of the initial semiconductor body into various self-contained units can also be carried out by ultrasonic drilling or by means of suitable sawing devices.

It will be understood that the above description of the present invention is susceptible to various modifications, changes and adaptations, and the same are intended to be comprehended within the meaning and range of equivalents of the appended claims.

I claim:

1. A semiconductor rectifying arrangement comprising a semiconductor body having a groove and two contact surfaces, said body further having two zones of the same conductivity type, said two zones being completely separated from one another by said groove, one of said two contact surfaces being a boundary surface of one of said two zones, the other of said two contact surfaces being a boundary surface of the other of said two zones, said body further having a third zone of conductivity type opposite to that possessed by said two zones, said third zone extending across the tip of the groove and forming pn-junctions with said two zones, said body further having a third contact surface being a boundary surface of said third zone, said third contact surface extending across the tip of the groove, and a conductive path on the third contact surface and extending across the tip of said groove, said body further having a transverse groove extending into said body transversely to the first groove, said body further having a second set of two zones of the same conductivity type, their conductivity being opposite to the conductivity type of the first two zones, the two zones of said second set being connected to the zones of the first two zones by ties at the tip of said transverse groove, whereby pn-junctions are formed between said second set and the first two zones, the two zones of said second set being completely separated from one another by a groove in said body, the two contact surfaces of the first two zones being coplanar at said ties with contact surfaces of said second set of zones, conductive paths on the two contact surfaces of the first two zones and extending across said ties onto the contact surfaces of said second set, whereby the pn-junctions between said second set and the first two zones are short-circuited, said body having a fourth zone of conductivity type opposite to that possessed by said second set, said fourth zone extending across the tip of the groove between the two zones of said second set and forming pn-junctions with the two zones of said second set, said body further having a fourth contact surface being a boundary of said fourth zone, said fourth contact surface extending across the tip of the groove between the two zones of said second set, and a conductive path on the fourth contact surface and extending across the tip of the groove between the two zones of said second set, said fourth zone being completely separated from said third zone by said transverse groove.

2. An arrangement as claimed in claim 1, the groove between the two zones of said second set being aligned with the groove between the first two zones.

3. An arrangement as claimed in claim 1, the first two zones bordering on the groove between them, the zones of said second set bordering on the groove between them.

4. An arrangement as claimed in claim 3, wherein edge-portions of the pn-junctions of the first two zones border on the groove between the first two zones, edge-portions of the pn-junctions of the zones of said second set border on the groove between the zones of said second set, wherein at least those portions of the pn-junctions of the first two zones that border on the groove between the first two zones lie in a common plane and wherein at least those portions of the pn-junctions of the zones of said second set that border on the groove between the zones of the second set lie in a common plane.

5. An arrangement as claimed in claim 4, the groove between the first two zones lying in a plane perpendicular to said common plane of the first two zones, the groove between the zones of said second set lying in a plane perpendicular to said common plane of said second set.

6. An arrangement as claimed in claim 1, said semiconductor body having the shape of a plate with a top surface and a bottom surface, the two sets of two zones being on the bottom surface, the third zone and the fourth zone being on the top surface, the orthogonal projections of the zones of the top and bottom surfaces onto a plane parallel to the top and bottom surfaces coinciding, zones coinciding in said orthogonal projections being of opposite conductivity type.

7. An arrangement as claimed in claim 6, said top surface and said bottom surface each being completely coated with conductive material except at the locations of said grooves.

8. An arrangement as claimed in claim 1, said body having at least on extra transverse groove, said body further having a third set of two zones of the same conductivity type, their conductivity being the same as the conductivity of the first two zones, the two zones of said third set being connected to the zones of said second set by ties at the tip of said extra transverse groove, whereby pn-junctions are formed between said second set and said third set, the two zones of said third set being completely separated from one another by a groove in said body, the contact surfaces of the second set being coplanar at the ties between the second and third sets with contact surfaces of said third set, said conductive paths on the two contact surfaces of the first two zones and on the contact surfaces of the second set extending across said ties between the second and third sets, whereby the pn-junctions between said second set and the third set are short-circuited, said body having a fifth zone of conductivity type opposite to that possessed by said third set, said fifth zone extending across the tip of the groove between the two zones of said third set and forming pn-junctions with the two zones of said third set, said body further having a fifth contact surface being a boundary of said fifth zone, said fifth contact surface extending across the tip of the groove between the two zones of said third set, and a conductive path on said fifth contact surface and extending across the tip of the groove between the two zones of said third set, said fifth zone being completely separated from said fourth zone by said extra transverse groove.

9. An arrangement as claimed in claim 8, said body having at least one extra first groove; the first set of zones formed by said first two zones, said second set, and said third set all containing an extra zone of the same conductivity type as that possessed by the initial two zones in the sets; the extra zones neighboring adjoining ones of the initial two zones in the sets and being completely separated from them by said extra first groove; said body further having extra contact surfaces forming boundary surfaces of said extra zones; said third, fourth and fifth zones extending across the tip of said extra first groove and forming pn-junctions with said extra zones; the conductive paths on said third, fourth and fifth zones extending across the tip of said extra groove; the pn-junctions formed by said third zone with the zones of said first set being coplanar in a first plane; the pn-junctions formed by said fourth zone with the zones of said second set being coplanar in a second plane spaced from said first plane; the pn-junctions formed by said fifth zone with the zones of said third set being coplanar and lying in said first plane.

* * * * *